United States Patent
Choi et al.

(10) Patent No.: US 11,509,334 B2
(45) Date of Patent: Nov. 22, 2022

(54) DECODING APPARATUS AND DECODING METHOD FOR DECODING OPERATION IN CHANNEL CODING

(71) Applicant: SAMSUNG ELECTRONICS CO., LTD., Suwon-si (KR)

(72) Inventors: Yeonjoon Choi, Hwaseong-si (KR); Sehyoung Kim, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 133 days.

(21) Appl. No.: 17/039,573

(22) Filed: Sep. 30, 2020

(65) Prior Publication Data
US 2021/0266015 A1    Aug. 26, 2021

(30) Foreign Application Priority Data
Feb. 26, 2020  (KR) .................. 10-2020-0023841

(51) Int. Cl.
| | | |
|---|---|---|
| *H03M 13/45* | (2006.01) | |
| *H03M 13/43* | (2006.01) | |
| *H04W 88/02* | (2009.01) | |
| *H03M 13/00* | (2006.01) | |
| *H03M 13/29* | (2006.01) | |
| *H03M 13/13* | (2006.01) | |

(52) U.S. Cl.
CPC ........... *H03M 13/45* (2013.01); *H03M 13/13* (2013.01); *H03M 13/2984* (2013.01); *H03M 13/43* (2013.01); *H03M 13/617* (2013.01); *H04W 88/02* (2013.01)

(58) Field of Classification Search
CPC ...... H03M 13/45; H03M 13/43; H03M 13/13; H03M 13/2984; H03M 13/617; H04W 88/02
See application file for complete search history.

(56) References Cited

U.S. PATENT DOCUMENTS

| | | | |
|---|---|---|---|
| 10,153,787 B2 | 12/2018 | El-Khamy | |
| 10,361,728 B2 | 7/2019 | Shi et al. | |
| 2018/0248564 A1* | 8/2018 | Kim | ............ H03M 13/13 |
| 2018/0331697 A1 | 11/2018 | Lin et al. | |
| 2019/0058547 A1 | 2/2019 | Hof et al. | |
| 2019/0068225 A1 | 2/2019 | Yu | |
| 2019/0165818 A1 | 5/2019 | Miyazaki | |

FOREIGN PATENT DOCUMENTS

KR    10-2018-0031555    3/2018

* cited by examiner

*Primary Examiner* — Curtis B Odom
(74) *Attorney, Agent, or Firm* — F. Chau & Associates, LLC

(57) ABSTRACT

The present disclosure relates to a decoding method. The decoding method includes a sequentially determining series of source bits from a codeword by performing a first decoding operation and a second decoding operation. For instance, a series of N source bits may be divided into a first bit group of X source bits and a second bit group of Y source bits. The initial X source bits are sequentially determined in the first decoding operation and the remaining Y source bits are sequentially determined in the second decoding operation. The first decoding operation includes sorting at least 2L reliability values, which are calculated from L bit sequences, where L is an integer greater than 0. The second decoding operation includes determining a source bit in each of the L bit sequences, based on the at least 2L reliability values.

19 Claims, 14 Drawing Sheets

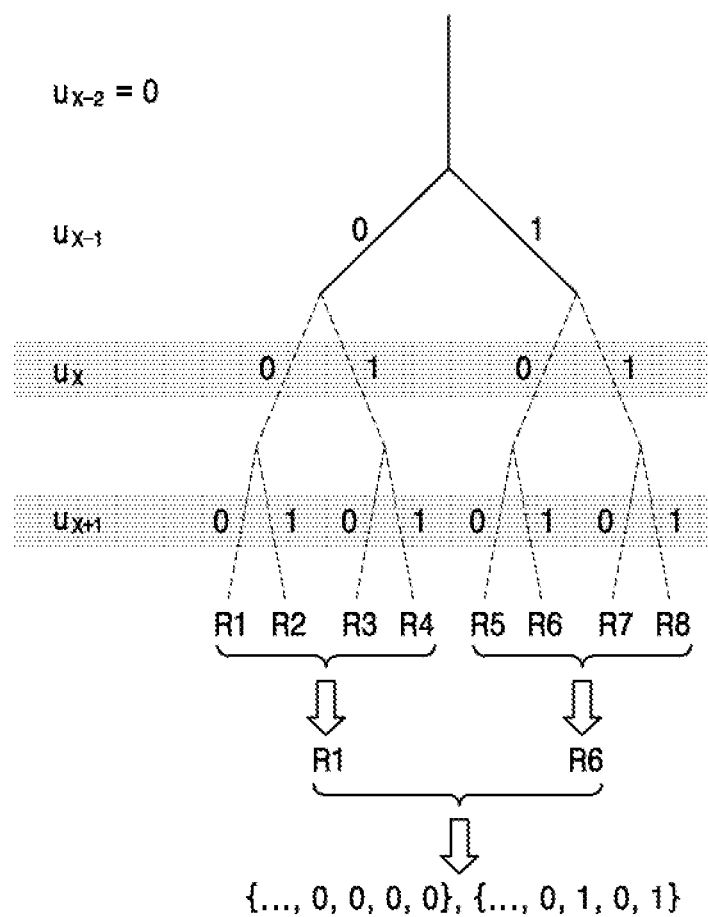

DECODING APPARATUS AND DECODING METHOD FOR DECODING OPERATION IN CHANNEL CODING

CROSS-REFERENCE TO RELATED APPLICATION

This application claims the benefit of Korean Patent Application No. 10-2020-0023841, filed on Feb. 26, 2020, in the Korean Intellectual Property Office, the disclosure of which is incorporated by reference herein in its entirety.

BACKGROUND

The inventive concept relates to channel coding, and more specifically to an apparatus and method for codeword decoding operations.

Communication systems provide the ability to transmit information between wireless devices, such as between base stations and user equipment (UEs). In such communication systems, channel coding techniques may be performed by a transmitting device and a receiving device, where the transmitting device encodes a signal for transmission and the receiving device decodes a received signal. For instance, transmitting devices may use channel coding techniques to encode information, such as bit streams, into codewords that may then be transmitted to another wireless device. A receiving device may receive transmitted signals and may use channel coding techniques to decode codewords and to detect and/or correct any errors in received signals. Code words are thus used to provide more robust communications between wireless devices and reduce errors in a communication system.

In some examples, channel coding adds redundant bits to a bit stream, increasing reliability of the signal in case of any information loss during transmission. For example, a transmitting device may encode data (a payload) to be transmitted with redundant bits into a codeword longer than the payload. After transmission, a receiving device may decode the received codeword. Therefore, if noise or interference exists in a channel resulting in any ambiguity or partial information loss, the receiving device may obtain the encoded data (the payload) due to the channel coding (e.g., due to the redundancy of the encoding scheme). In some examples, the transmitting device and the receiving device may perform such encoding and decoding operations at high speed and as efficiently as possible to increase channel throughput and to reduce costs (e.g., latency, power consumption, etc.) of the encoding and decoding operations.

As wireless communication systems evolve (e.g., as $5^{th}$ generation new-radio (5G NR) technology is developed), increased performance and efficiency of channel coding is desired. Therefore, there is a need in the art for higher performing channel coding operations to increase performance of communication systems and reduce demands of wireless devices.

SUMMARY

The inventive concept provides a decoding apparatus and a decoding method, which may simultaneously provide high performance and high efficiency in channel coding.

According to an aspect of the inventive concept, there is provided a decoding method for sequentially determining a series of source bits from a codeword. The method includes a first decoding operation to sequentially determine an initial X source bits from the series of source bits and a second decoding operation to sequentially determine a remaining Y source bits from the series of source bits. The first decoding operation includes sorting at least 2L reliability values, which are calculated from L bit sequences, where L is an integer greater than 0. The second decoding operation includes determining a source bit in each of the L bit sequences based on the at least 2L reliability values.

According to another aspect of the inventive concept, there is provided an apparatus for polar decoding that is configured to sequentially determine a series of source bits from a codeword encoded based on a polar code. The apparatus includes a reliability calculator configured to calculate at least 2L reliability values from L bit sequences where L is an integer greater than 0, a first processing circuit configured to sort the at least 2L reliability values and respectively generate first L new bit sequences with L upper reliability values, a second processing circuit configured to determine a source bit in each of the L bit sequences based on the at least 2L reliability values and generate second L new bit sequences, and a selection circuit configured to select one of the first processing circuit and the second processing circuit based on indices of source bits included in the series of source bits.

According to another aspect of the inventive concept, there is provided a polar decoding method by which a series of source bits are obtained from a codeword encoded based on a polar code. The method includes a first decoding operation in which source bits included in a first bit group are sequentially determined from the codeword based on a successive cancellation list (SCL) decoding scheme. The method further includes a second decoding operation in which source bits included in a second bit group are sequentially determined from the codeword based on a successive cancellation (SC) decoding scheme. The first bit group includes an initially determined source bit and the second bit group includes a finally determined source bit.

According to an aspect of the inventive concept, there is provided a decoding method for sequentially determining a series of source bits from a codeword. The method includes determining a plurality of reliability values, wherein the reliability values are determined based on a plurality of bit sequences. The method further includes sorting the reliability values and decoding a first set of source bits based on the sorted reliability values. The method further includes determining a source bit from each of the plurality of bit sequences and decoding a second set of source bits based on the source bit determined from each of the plurality of bit sequences, wherein a block of source data comprises the second set of source bits and the first set of source bits.

BRIEF DESCRIPTION OF THE DRAWINGS

Embodiments of the inventive concept will be more clearly understood from the following detailed description taken in conjunction with the accompanying drawings in which:

FIG. 7B is a diagram of an example of a decoding tree formed using a decoding method according to an example embodiment;

DETAILED DESCRIPTION OF THE EMBODIMENTS

Figure 1:
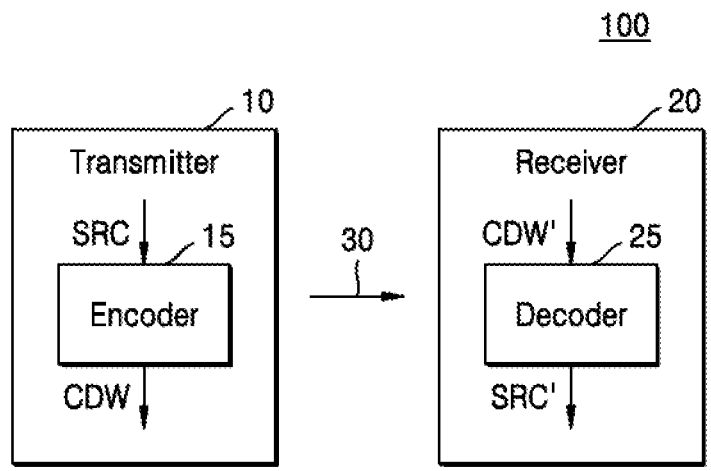
FIG. 1 is a block diagram of a communication system including a transmitter and a receiver, according to an example embodiment.

Various decoding processes have been developed for use in $5^{th}$ generation new-radio (5G NR) communication. In some cases, less complex (e.g., less computationally intensive) channel coding techniques may be associated with lower reliability, while more complex channel coding techniques may be more computationally intensive but may be associated with increased reliability (e.g., less decoding errors at a receiver).

The present disclosure relates generally to an improved decoding method. Specifically, embodiments of the present disclosure relate to channel coding techniques capable of more efficient, or less computationally intensive, decoding of data while maintaining reliable decoding performance.

Embodiments of the present disclosure sequentially determine source bits of a codeword via a list decoding scheme and a decision decoding scheme. In some cases, as compared to the list decoding scheme, the decision decoding scheme may have lower complexity and be more cost-effective (e.g., but may be associated with a relatively higher block error rate). However, decoding reliability may be gradually increased during the process of sequentially determining source bits of a received codeword. For example, as the number of determined source bits increases, a deviation between reliability values of candidates may increase during subsequent determination processes, and a candidate with a high reliability value may be determined as a source bit. The techniques described herein may provide for efficient balancing of sequentially determining sources bits of a codeword via both a list decoding scheme and a decision decoding scheme based on usage of the decision decoding scheme later in the decoding process where the decoding reliability is increased. Accordingly, the less complex decision decoding scheme may be implemented as a more cost effective solution later in the decoding process without substantially reducing the decoding reliability.

For instance, a receiving device may decode a received codeword to sequentially determine N source bits. The N source bits may be determined in two bit groups. The first bit group may include X bits determined via the list decoding scheme and the second bit group may include Y bits determined via the decision decoding scheme (e.g., where X+Y=N). In some cases, the number of bits in each of the bit groups (e.g., the number of X bits and the number of Y bits) may be determined based on the number N and a number of information bits included in N (e.g., as N may include both K information bits as well as a number of redundancy bits such that K<N).

Accordingly, the first bit group of X source bits may be decoded via a list decoding scheme. The list decoding scheme may refer to a decoding scheme of sequentially determining X source bits while maintaining a plurality of bit sequences as candidates. In some examples, the list decoding scheme may include a successive cancellation list (SCL) decoding scheme or a simplified successive cancellation list (SSCL) decoding scheme. The second bit group of Y source bits may be decoded via a decision decoding scheme. The decision decoding scheme may refer to a scheme of determining source bits, based on reliability values of bits to be determined and adding the determined source bits to an existing bit sequence. In some examples, the decision decoding scheme may include a successive cancellation (SC) decoding scheme. However, as described above, due to increased decoding reliability as the index of the determined source bit increases (e.g., as the number source bits determined for the codeword increases), the decoding reliability of the second bit group of Y source bits that are determined using the decision decoding scheme may not be substantially reduced.

FIG. 1 is a block diagram of a communication system 100 including a transmitter 10 and a receiver 20, according to an example embodiment. As shown in FIG. 1, the transmitter 10 and the receiver 20 may communicate with each other through a channel 30.

The communication system 100 may be an arbitrary communication system that defines a communication protocol between the transmitter 10 and the receiver 20. In some embodiments, the channel 30 may be wireless communication using a radio resource, and the communication system 100 may be a wireless communication system. For example, the communication system 100 may be a wireless communication system using a cellular network (e.g., a 5th-generation wireless (5G) new-radio (NR) system, a long-term evolution (LTE) system, an LTE-Advanced system, a code division multiple access (CDMA) system, and a global system for mobile communications (GSM) system), a wireless personal area network (WPAN) system, or another arbitrary wireless communication system. In some embodiments, the channel 30 may be a wired channel using electric signals and/or optical signals, and the communication system 100 may be a wired communication system. Hereinafter, the communication system 100 will mainly be described with reference to a wireless communication system, particularly, a 5G NR system that may be a wireless communication system using a cellular network, but example embodiments are not limited thereto.

When the communication system 100 is a wireless communication system using a cellular network, each of the transmitter 10 and the receiver 20 may be a base station (BS) or user equipment (UE). When the transmitter 10 is a BS and the receiver 20 is UE, a downlink may be formed in the channel 30. In contrast, when the transmitter 10 is UE and the receiver 20 is a BS, an uplink may be formed in the channel 30. Additionally or alternatively, when each of the transmitter 10 and the receiver 20 is UE, a sidelink may be formed in the channel 30.

The BS may generally refer to a fixed station configured to communicate with UE and/or another BS. The BS may communicate with the UE and/or the other BS and exchange data and control information with the UE and/or the other BS. For example, the BS may be referred to as Node B, evolved-Node B (eNB), next-generation Node B (gNB), a sector, a site, a base transceiver system (BTS), an access point (AP), a relay node, a remote radio head (RRH), a radio unit (RU), or a small cell. As used herein, the BS or a cell may be interpreted as a partial area or function covered by a base station controller (BSC) of CDMA, Node-B of WCDMA, eNB of LTE, gNB of 5G, or a sector (site) and cover various coverage areas, such as a megacell, a macrocell, a microcell, a picocell, a femtocell, a relay node, an RRH, an RU, and a small-cell communication range. The UE may be stationary or mobile and may refer to any devices capable of communicating with a BS and transmitting and receiving data and/or control information to and from the BS. For example, the UE may be referred to as a terminal, terminal equipment, a mobile station (MS), a mobile terminal (MT), a user terminal (UT), a subscriber station (SS), a wireless device, or a handheld device.

A wireless communication network between the UE and the BS may share available network resources and support the communication of a plurality of users. For example, in the wireless communication network, information may be transmitted using various multiple access methods, such as code division multiple access (CDMA), frequency division multiple access (FDMA), time division multiple access (TDMA), orthogonal frequency division multiple access (OFDMA), single carrier frequency division multiple access (SC-FDMA), OFDM-FDMA, OFDM-TDMA, and OFDM-CDMA.

The transmitter 10 may transmit signals through the channel 30, and the receiver 20 may receive signals through the channel 30. The communication system 100 may define channel coding. Therefore, the transmitter 10 may transmit an encoded signal through the channel 30, and the receiver 20 may decode a signal received through the channel 30. For instance, the communication system 100 may define channel coding based on a polar code, a Reed-Solomon code, a convolution code or the like.

As shown in FIG. 1, the transmitter 10 may include an encoder 15 and the receiver 20 may include a decoder 25 to enable channel coding schemes for communications from the transmitter 10 to the receiver 20 over the channel 30. As shown in FIG. 1, the encoder 15 of the transmitter 10 may encode source data SRC and generate a codeword CDW, while the receiver 20 may decode a codeword CDW' and generate source data SRC'. Due to noise and interference caused in the channel 30, the codeword CDW generated by the transmitter 10 may be different from the codeword CDW' generated by the receiver 20. However, the decoder 25 may generate the source data SRC', which matches the source data SRC of the transmitter 10 with high reliability. For example, decoder 25 may determine source bits of the source data SRC' according to the techniques described herein. Source bits may refer to a unit of the source data SRC', where each source bit may have a single binary value, either 0 or 1. Accordingly, receiver 20 may generate source data SRC' via determination of the source bits. The source data SRC' may be generated to match source data SRC and thus effectively enable communication between the transmitter 10 and the receiver 20. The encoder 15 and/or the decoder 25 may include a logic block designed by logic synthesis and include software including a series of instructions and at least one core configured to execute the software. In some embodiments, the transmitter 10 may further include a decoder, and the receiver 20 may further include an encoder.

In the communication system 100, to obtain high throughput, the transmitter 10 and the receiver 20 may be used to process large amounts of data with high reliability in a short period of time. For example, a 5G NR communication system may define scenarios, such as ultra-reliable low-latency communication (URLLC) and enhanced mobile broadband (eMBB), in which the transmitter 10 and the receiver 20 may be used. Accordingly, the encoder 15 of the transmitter 10 and the decoder 25 of the receiver 20 may be used to process data at high speed with high reliability. In particular, when the transmitter 10 and/or receiver 20 are a part of a UE in a wireless communication system, the transmitter 10 and/or the receiver 20 may be used for high performance and high efficiency (e.g., a small coverage area and low power consumption).

As described below with reference to the drawings, the decoder 25 of the receiver 20 may decode the codeword CDW', based on two different decoding schemes, thereby simultaneously achieving high reliability and reduced complexity. For example, a decoding operation may generally refer to an operation to convert a coded message (e.g., a received codeword CDW') into intelligible source data SRC'. Different schemes or methods by which a decoding operation may be performed may be associated with different computation operations and thus different levels of reliability (e.g., or accuracy). According to the described techniques for efficiently using two different encoding schemes, the receiver 20 may support high throughput (e.g., via faster, reduced complexity decoding schemes) and have increased efficiency (e.g., via increased reliability).

Figure 2:
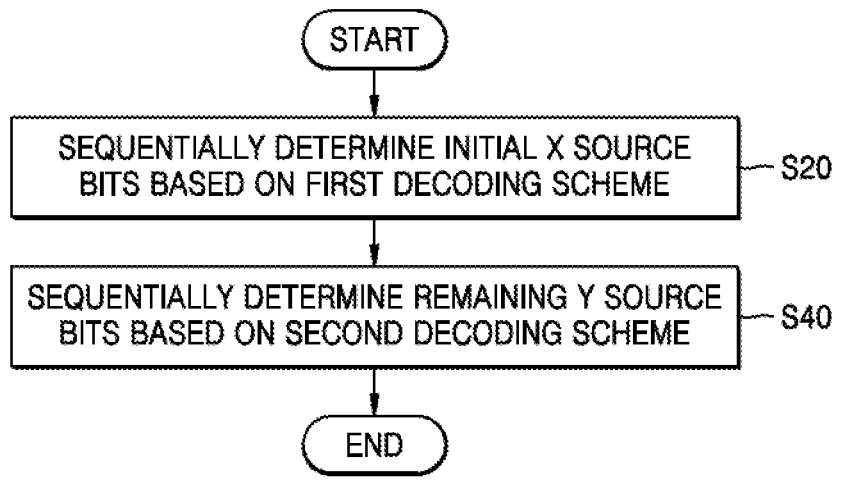
FIG. 2 is a flowchart of an example of a decoding method according to an example embodiment.

FIG. 2 is a flowchart of an example of a decoding method according to an example embodiment. As shown in FIG. 2, the decoding method may include operations S20 and S40. In some embodiments, the decoding method of FIG. 2 may be performed by the decoder 25 of FIG. 1. Hereinafter, FIG. 2 will be described with reference to FIG. 1.

In some embodiments, the source data SRC' of FIG. 1 may include a series of source bits, and the decoder 25 may decode a codeword CDW' by sequentially determining the series of source bits. As used herein, the source data SRC' may be assumed to include N source bits (N is an integer greater than 1). The decoder 25 may divide the series of source bits into at least two bit groups and determine the source bits of each divided bit group based on different decoding schemes.

Referring to FIG. 2, in operation S20, an operation of sequentially determining initial X source bits based on a first decoding scheme may be performed. For example, the decoder 25 may sequentially determine initial X source bits, from among the N source bits included in the source data SRC', based on the first decoding scheme (N>X). In some embodiments, the first decoding scheme may have a higher complexity than a second decoding scheme to be described below. Accordingly, a decoding process performed in operation S20 may provide high reliability, but the decoding process may take a relatively long period of time and consume high power. As used herein, operation S20 may be referred to as a first decoding operation, and examples of operation S20 will be described below with reference to FIGS. 4A and 6A.

In operation S40, an operation of sequentially determining remaining Y source bits based on the second decoding scheme may be performed. For example, the decoder 25 may sequentially determine remaining Y source bits other than the X source bits determined in operation S20, from among the N source bits included in the source data SRC', based on the second decoding scheme (N=X+Y). In some embodiments, the second decoding scheme may have a lower complexity than the first decoding scheme. However, as described below with reference to FIG. 3, reliability may be increased as source bits are sequentially determined. Therefore, a decoding process performed in operation S40 may provide reliability that may not be substantially reduced, while taking a relatively short period of time and consuming low power. Accordingly, as compared to the process of determining the N source bits based on the first decoding scheme, the decoding method of FIG. 2 may take a shorter period of time and consume less power while maintaining high reliability. As used herein, operation S40 may be referred to as a second decoding operation, and examples of operation S40 will be described below with reference to FIGS. 5A and 7A.

Figure 3:
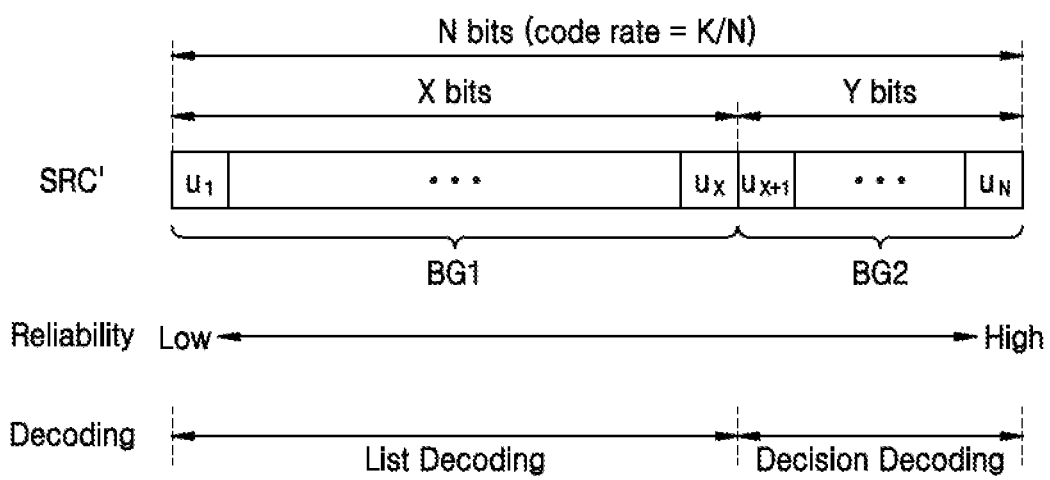
FIG. 3 is a diagram of an example of source data formed using a decoding method according to an example embodiment.

FIG. 3 illustrates an example of source data generated using a decoding method according to an example embodiment. As described above with reference to FIGS. 1 and 2, source data SRC' of FIG. 3 may be generated by decoding a codeword CDW' and include source bits sequentially determined during a decoding process. In the example of FIG. 3, the first decoding scheme of FIG. 2 may correspond to a list decoding scheme, and a second decoding scheme may correspond to a decision decoding scheme. Hereinafter, FIG. 3 will be described with reference to FIGS. 1 and 2.

The source data SRC' may include N source bits. For example, first to N-th source bits $u_1$ to $u_N$. The N source bits may include K information bits and (N−K) redundancy bits (0<K<N). The information bits may refer to bits indicating useful information. As shown in FIG. 3, a code rate may be defined as K/N.

In some embodiments, the source data SRC' may include K information bits and (N−K) frozen bits. For example, the communication system 100 of FIG. 1 may adopt, as channel coding, a polar code capable of achieving Shannon capacity with a relatively low encoding/decoding complexity. The polar code may transmit information bits through a good bit channel and transmit frozen bits through a bad bit channel by using channel polarization in which bit channels (or subchannels) observed at a transmitting side are polarized into the good bit channel and the bad bit channel. Values and positions (i.e., indices) of the frozen bits of the source data SRC' may be commonly known to the transmitter 10 and the receiver 20. The decoder 25 of the receiver 20 may decode the codeword CDW' based on the values and indices of the frozen bits.

Polar coding is a form of channel coding based on a block code method. In polar coding, each block of data to be encoded has a set number of bits. A manipulation to the block is performed at the transmitter 10 and receiver 20. For example, Channel Combining and Channel Splitting are performed on each block of data. First, Channel Combining assigns and/or maps combinations of symbols to channels. Then, Channel Splitting performs a transformation operation, translating symbol combinations into time domain vectors used in the decoder. The decoding operation, with the encoding operation, estimates time domain bit streams. This converts the block of bits and channels into a polarized bit stream (e.g., source bits) at the receiver 20. Polar codes have been shown to achieve capacity for Additive white Gaussian noise (AWGN) channels and achieve comparable performance to Low-density parity-check code (LDPC) for finite length code using a SCL decoder 25 with cyclic redundancy checks (CRC). The SCL decoder 25 may have a high latency because each bit is decoded successively. In some cases, a neural network decoder 25 can be used in Polar codes.

The N source bits (i.e., the first to N-th source bits $u_1$ to $u_N$) may be sequentially determined. As shown in FIG. 3, reliability may be gradually increased during the process of sequentially determining the first to N-th source bits $u_1$ to $u_N$. For example, as the number of determined source bits increases, a deviation between reliability values of candidates may increase during subsequent determination processes, and a candidate with a high reliability value may be determined as a source bit.

The source data SRC' may include a first bit group BG1 and a second bit group BG2. The first bit group BG1 may include X source bits including the first source bit $u_1$, which is an initially determined source bit, for example, first to X-th source bits $u_1$ to $u_X$, and the second bit group BG2 may include Y source bits including the N-th source bit $u_N$, which is a finally determined source bit, for example, (X+1)-th to N-th source bits $u_{X+1}$ to $u_N$ (N=X+Y). In some embodiments, the first bit group BG1 and the second bit group BG2 may be determined based on different decoding schemes. For instance, as shown in FIG. 3, the first bit group BG1 may be determined based on a list decoding scheme. The second bit group BG2 may be determined based on a decision decoding scheme.

The list decoding scheme may refer to a decoding scheme of sequentially determining source bits while maintaining a plurality of bit sequences as candidates. For example, as described below with reference to FIGS. 4A and 4B, when the communication system 100 of FIG. 1 adopts a polar code, source bits of the first bit group BG1 may be determined based on a SCL decoding scheme. As described below with reference to FIGS. 6A and 6B, source bits of the first bit group BG1 may be determined based on a SSCL decoding scheme. As used herein, the SCL decoding and SSCL decoding schemes may be referred to collectively as an SCL decoding scheme, and the SSCL decoding scheme may be referred to as an example of the SCL decoding scheme. As compared to the decision decoding scheme to be described below, the list decoding scheme may have a higher complexity, provide higher reliability (e.g., a lower block error rate (BLER)), and be less cost-effective.

The decision decoding scheme may refer to a scheme of determining source bits, based on reliability values of bits to be determined and adding the determined source bits to an existing bit sequence. For example, when the communication system 100 of FIG. 1 adopts a polar code, the source bits of the second bit group BG2 may be determined, based on a SC decoding scheme, as described below with reference to FIGS. 5A and 7A. As compared to the list decoding scheme described above, the decision decoding scheme may have lower complexity, provide lower reliability (e.g., a higher block error rate), and be more cost-effective. However, as described above, due to increased reliability as the index of the determined source bit increases, reliability (which may be referred to as decoding reliability) of the second bit group BG2 determined using the decision decoding scheme may not be substantially reduced.

Hereinafter, channel coding will mainly be described with reference to a polar code, but example embodiments are not limited thereto. For example, the example embodiments may be applied to any channel coding scheme (e.g., a Reed-Solomon code and a convolution code) to which both the list decoding scheme and the decision decoding scheme may be applied.

Figure 4A:
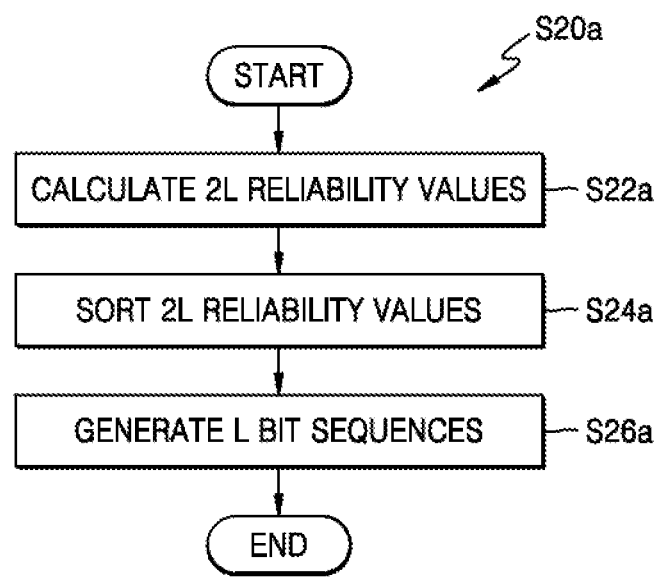
FIG. 4A is a flowchart of an example of a decoding method according to an example embodiment.
Figure 4B:
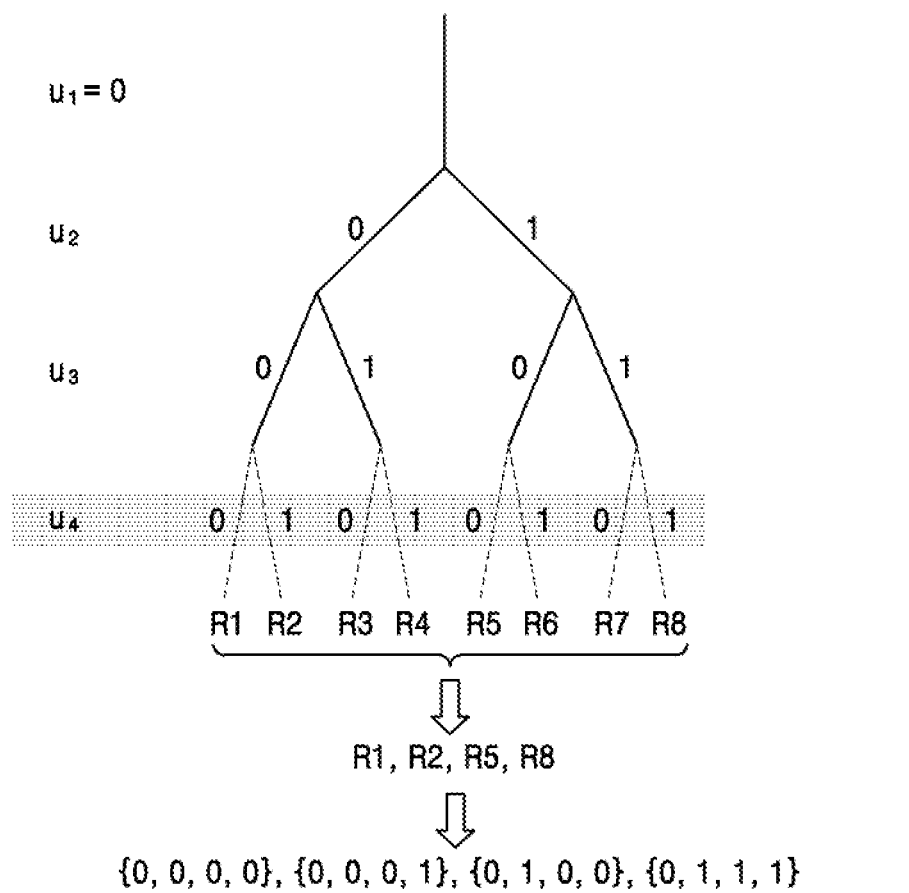
FIG. 4B is a diagram of an example of a decoding tree formed using a decoding method according to an example embodiment.

FIG. 4A is a flowchart of an example of a decoding method according to an example embodiment. FIG. 4B is a diagram of an example of a decoding tree formed using a decoding method according to an example embodiment. Specifically, the flowchart of FIG. 4A illustrates an example of operation S20 of FIG. 2, and FIG. 4B illustrates an example of a decoding tree formed due to operation S20a of FIG. 4A. As described above with reference to FIG. 2, an operation of sequentially determining initial X source bits based on the first decoding scheme may be performed in operation S20a of FIG. 4A. In some embodiments, operation S20a of FIG. 4A may be performed by the decoder 25 of FIG. 1. Hereinafter, FIGS. 4A and 4B will be described with reference to FIGS. 1 and 3.

Referring to FIG. 4A, in operation S20a, X source bits included in the first bit group BG1 may be sequentially determined based on an SCL decoding scheme, which is an example of the first decoding scheme of FIG. 2. In the example of FIG. 4A, the SCL decoding scheme may maintain L bit sequences or fewer as candidates (L is an integer greater than 1), and L may be assumed to be 4 in the decoding tree of FIG. 4B (L=4). As shown in FIG. 4A, operation S20a may include a plurality of operations (e.g., S22a, S24a, and S26a).

In operation S22a, an operation of calculating 2L reliability values may be performed. For instance, as shown in FIG. 4B, the decoder 25 may determine first to third source bits $u_1$ to $u_3$ based on an SCL decoding scheme and then attempt to determine a fourth source bit $u_4$. The decoder 25 may sequentially determine first to third source bits $u_1$ to $u_3$ such that the first source bit $u_1$ is determined, then the second source bit $u_2$ is determined, and then the third source bit $u_3$ is determined (e.g., such that each of $u_1$, $u_2$, and $u_3$ is determined in sequence). The first source bit $u_1$ may have a value of '0' as a frozen bit, while the second to fourth source bits $u_2$ to $u_4$ may be information bits. The decoder 25 may calculate first to eighth reliability values R1 to R8 from four bit sequences (i.e., {0, 0, 0}, {0, 0, 1}, {0, 1, 0}, and {0, 1, 1}) as candidates including the first to third source bits $u_1$ to $u_3$. Each of the first to eighth reliability values R1 to R8 may indicate reliability when the fourth source bit $u_4$ has a value of '0' or '1' in each of the four bit sequences. A reliability value may be referred to as a path metric (PM) and calculated using an arbitrary method. For example, the decoder 25 may calculate the reliability values based on a log-likelihood ratio (LLR).

In operation S24a, an operation of sorting the 2L reliability values may be performed. In some embodiments, the decoder 25 may sort the 2L reliability values calculated in operation S22a to generate L bit sequences as new candidates. For example, the decoder 25 may sort the first to eighth reliability values R1 to R8 of FIG. 4B to generate 4 bit sequences.

In operation S26a, an operation of generating L bit sequences may be performed. In some embodiments, the decoder 25 may generate L new bit sequences from values of source bits corresponding to L upper reliability values, from among the 2L reliability values, and bit sequences corresponding to the values of the source bits. For example, as shown in FIG. 4B, 4 upper reliability values (i.e., the first reliability value R1, the second reliability value R2, the fifth reliability value R5, and the eighth reliability value R8) may be selected from among the first to eighth reliability values R1 to R8. Therefore, 4 new bit sequences (i.e., {0, 0, 0, 0}, {0, 0, 0, 1}, {0, 0, 1, 0}, and {0, 1, 1, 1}) may be generated as candidates.

As described above, operation S20a may provide high reliability by determining the source bits while maintaining L candidates. Additionally or alternatively, operation S20a may include operation S24a of sorting the 2L reliability values to select L upper reliability values. The sorting of the reliability values may have a complexity calculated by Equation 1 provided below according to a sorting method where K is the number of information bits and L is the number of candidates.

$$C_{serial} = K \cdot 2L \cdot \log_2 2L$$

$$C_{radix} = K \cdot L \cdot (2L-1)$$

$$C_{bitonic} = K \cdot L/2 \log_2 2L \cdot (\log_2 L + 1) \qquad \text{[Equation 1]}$$

The operation of sorting the reliability values may increase the complexity of the decoding method based on the SCL decoding scheme as shown in Equation 1. However, as described below with reference to FIGS. 5A and 5B, the operation of sorting the 2L reliability values may be omitted from a decoding method based on an SC decoding scheme.

Figure 5A:
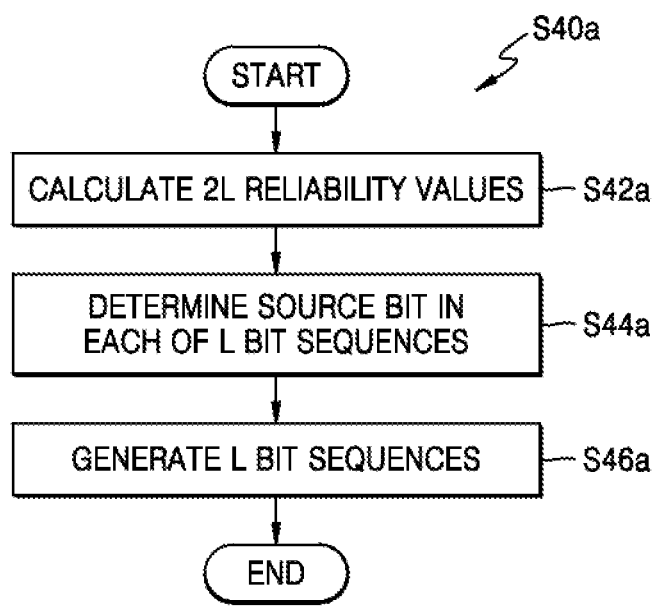
FIG. 5A is a flowchart of an example of a decoding method according to an example embodiment.
Figure 5B:
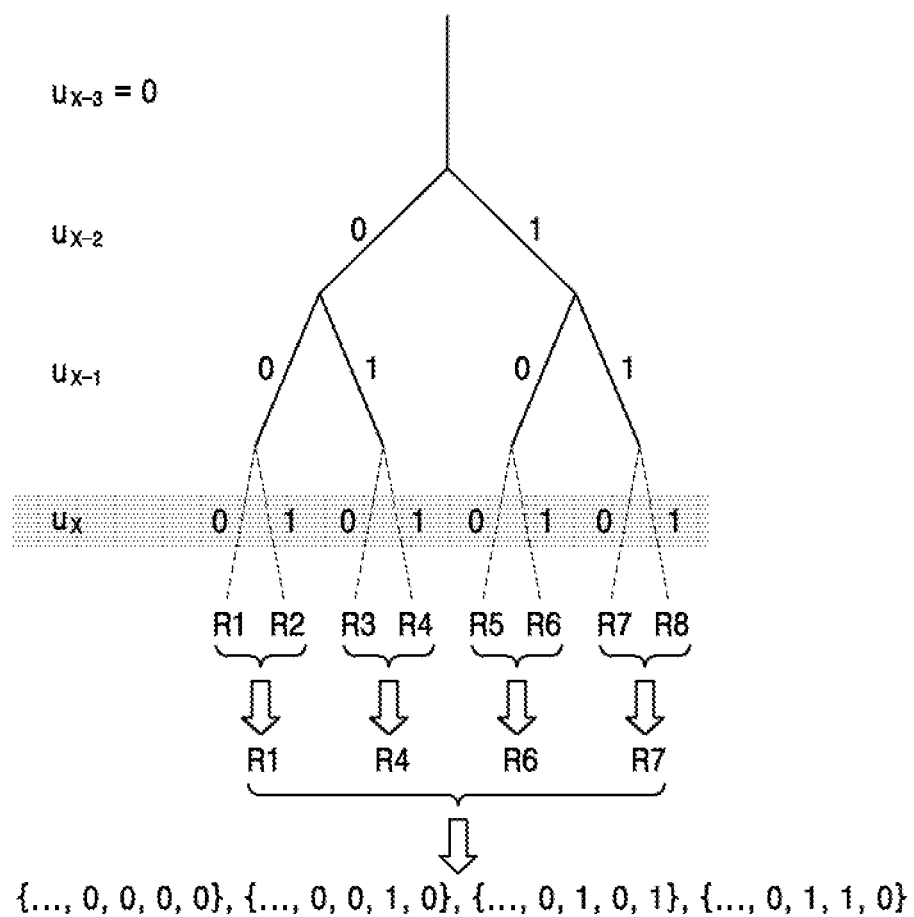
FIG. 5B is a diagram of an example of a decoding tree formed using a decoding method according to an example embodiment.

FIG. 5A is a flowchart of an example of a decoding method according to an example embodiment. FIG. 5B is a diagram of an example of a decoding tree formed using a decoding method according to an example embodiment. Specifically, the flowchart of FIG. 5A illustrates an example of operation S40 of FIG. 2, and FIG. 5B illustrates an example of a decoding tree formed due to operation S40a of FIG. 5A. As described above with reference to FIG. 2, an operation of sequentially determining remaining Y source bits based on a second decoding scheme may be performed in operation S40a of FIG. 5A. In some embodiments, operation S40a of FIG. 5A may be performed by the decoder 25 of FIG. 1. Hereinafter, FIGS. 5A and 5B will be described with reference to FIGS. 1 and 3. The same description as in FIGS. 4A and 4B will be omitted from the description of FIGS. 5A and 5B.

Referring to FIG. 5A, in operation S40a, Y source bits included in the second bit group BG2 may be sequentially determined based on an SC decoding scheme, which is an example of the second decoding scheme of FIG. 2. In the example of FIG. 5A, the SC decoding scheme may perform a decision based on reliability values in each of the L bit sequences generated based on the list decoding scheme adopted in operation S20 of FIG. 2 (e.g., the SCL decoding scheme of FIG. 4A). Additionally or alternatively, the SC decoding scheme may maintain the L bit sequences as candidates. L may be assumed to be 4 in the decoding tree of FIG. 5B (L=4). As shown in FIG. 5A, operation S40a may include a plurality of operations (e.g., S42a, S44a, and S46a).

In operation S42a, an operation of calculating 2L reliability values may be performed. For example, as shown in FIG. 5B, the decoder 25 may determine (X−3)-th to (X−1)-th source bits $u_{X-3}$ to $u_{X-1}$ based on a first decoding scheme (e.g., the SCL decoding scheme) and then attempt to determine an X-th source bit $u_X$ based on the second decoding scheme (e.g., the SC decoding scheme). Similar to the decoding tree of FIG. 4B, the (X−3)-th source bit $u_{X-3}$ may have a value of '0' as a frozen bit, while the (X−2)-th to X-th source bits $u_{X-2}$ to $u_X$ may be information bits. The decoder

25 may calculate first to eighth reliability values R1 to R8 from 4 bit sequences (i.e., { . . . , 0, 0, 0}, { . . . , 0, 0, 1}, { . . . , 0, 1, 0}, and { . . . , 0, 1, 1}) as candidates including the (X−3)-th to (X−1)-th source bits $u_{X-3}$ to $u_{X-1}$.

In operation S44a, an operation of determining a source bit in each of the L bit sequences may be performed. In some embodiments, the decoder 25 may determine a value corresponding to a high reliability, from among each of L pairs of reliability values, which respectively correspond to '0' and '1,' as the source bit. For example, as shown in FIG. 5B, the decoder 25 may compare reliability values in each of four pairs of reliability values and determine a relatively high reliability value. Therefore, four reliability values (i.e., the first reliability value R1, the fourth reliability value R4, the sixth reliability value R6, and the seventh reliability value R7) may be determined from among the first to eighth reliability values R1 to R8.

In operation S46a, an operation of generating L bit sequences may be performed. In some embodiments, the decoder 25 may determine a value of a source bit in each of the L pairs of reliability values and generate the L bit sequences. For example, as shown in FIG. 5B, based on the first reliability value R1, the fourth reliability value R4, the sixth reliability value R6, and the seventh reliability value R7 determined in operation S44a, four new bit sequences (i.e., { . . . , 0, 0, 0, 0}, { . . . , 0, 0, 0, 1}, { . . . , 0, 1, 0, 0}, and { . . . , 0, 1, 1, 1}) may be generated as candidates. As a result, in operation S40a, to generate the L bit sequences based on the 2L reliability values, a complexity proportional to L may be added to total complexity, and correspond to a complexity much lower than the complexity of the sorting operation, which is expressed by Equation 1.

Figure 6A:
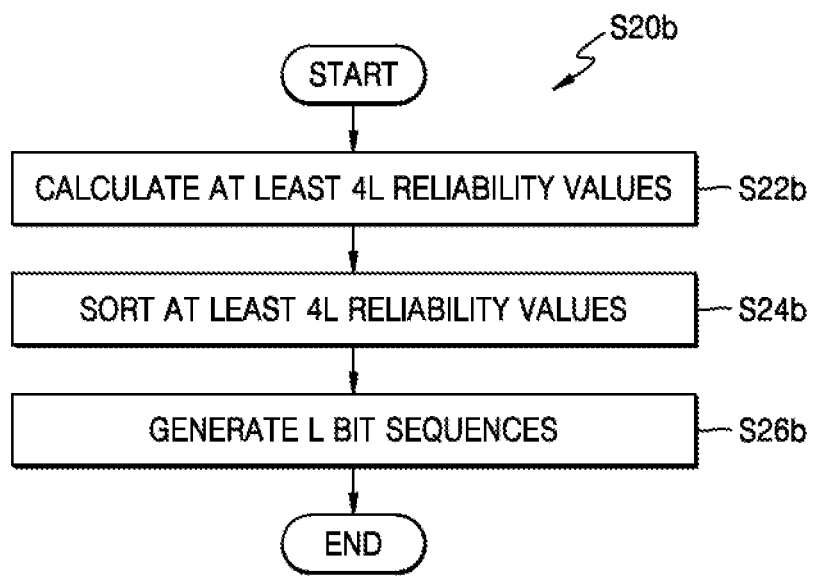
FIG. 6A is a flowchart of an example of a decoding method according to an example embodiment.
Figure 6B:
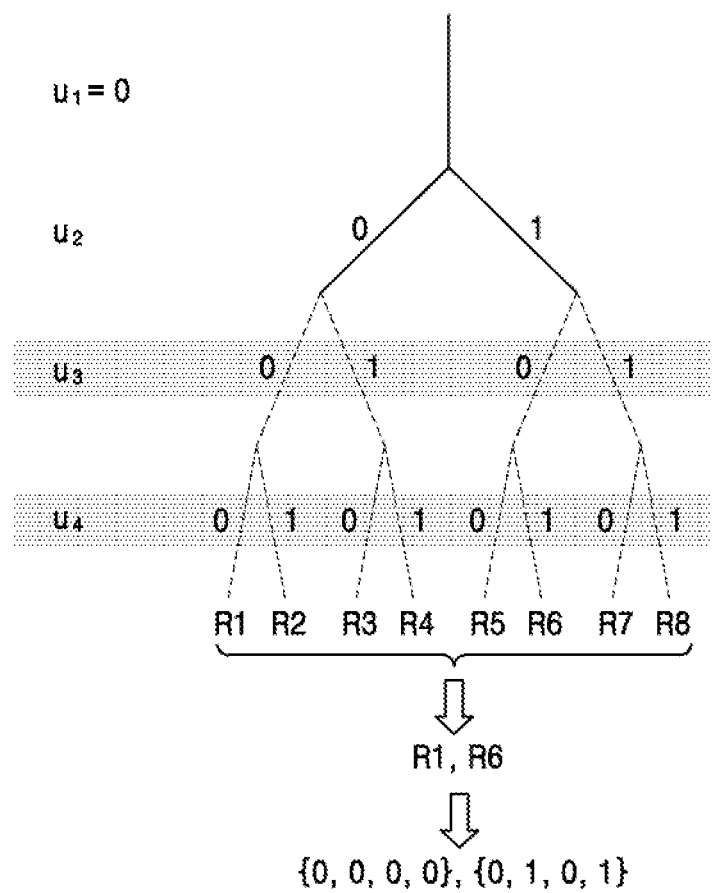
FIG. 6B is a diagram of an example of a decoding tree formed using a decoding method according to an example embodiment.

FIG. 6A is a flowchart of an example of a decoding method according to an example embodiment. FIG. 6B is a diagram of an example of a decoding tree formed using a decoding method according to an example embodiment. Specifically, the flowchart of FIG. 6A illustrates an example of operation S20 of FIG. 2, and FIG. 6B illustrates an example of a decoding tree formed due to operation S20b of FIG. 6A. As described above with reference to FIG. 2, an operation of sequentially determining initial X source bits based on a first decoding scheme may be performed in operation S20b of FIG. 6A. In some embodiments, operation S20b of FIG. 6A may be performed by the decoder 25 of FIG. 1. Hereinafter, FIGS. 6A and 6B will be described with reference to FIGS. 1 and 3.

Referring to FIG. 6A, in operation S20b, X source bits included in the first bit group BG1 may be sequentially determined based on an SSCL decoding scheme, which is an example of the first decoding scheme of FIG. 2. In the SSCL decoding scheme, nodes of the decoding tree may be classified into a Rate-0 node where source bits are frozen bits, a repetition (REP) node where a last source bit is an information bit, a single parity check (SPC) node where a first source bit is a frozen bit, and a Rate-1 node where source bits are information bits, and a subsequent operation may be differently performed according to a node type. In the example of FIG. 6A, the SSCL decoding scheme may maintain L or fewer bit sequences as candidates and simultaneously determine at least two source bits. L may be assumed to be 2 in the decoding tree of FIG. 4 (L=2). As shown in FIG. 5A, operation S20b may include a plurality of operations (e.g., S22b, S24b, and S26b).

In operation S22b, an operation of calculating 4L reliability values may be performed. For instance, as shown in FIG. 6B, the decoder 25 may determine first and second source bits $u_1$ and $u_2$ based on the SSCL decoding scheme and then attempt to determine third and fourth source bits $u_3$ and $u_4$. The first source bit $u_1$ may have a value of '0' as a frozen bit, while the second to fourth source bits $u_2$ to $u_4$ may be information bits. The decoder 25 may calculate first to eighth reliability values R1 to R8 from two bit sequences (i.e., {0, 0} and {0, 1}) corresponding to the first and second source bits $u_1$ and $u_2$.

In operation S24b, an operation of sorting the 4L reliability values may be performed. In some embodiments, the decoder 25 may sort the 4L reliability values, which were calculated in operation S22b, to generate L bit sequences as new candidates. For example, the decoder 25 may sort the first to eighth reliability values R1 to R8 of FIG. 6B to generate 2 bit sequences.

In operation S26b, an operation of generating L bit sequences may be performed. In some embodiments, the decoder 25 may generate L new bit sequences from values of source bits corresponding to L upper reliability values, from among the 4L reliability values, and bit sequences corresponding to the values of the source bits. For example, as shown in FIG. 6B, two upper reliability values (i.e., the first reliability value R1 and the sixth reliability value R6) may be selected from the first to eighth reliability values R1 to R8. Therefore, two new bit sequences (i.e., {0, 0, 0, 0} and {0, 1, 0, 1}) may be generated as candidates.

As described above, the SSCL decoding scheme may simultaneously determine two source bits. Additionally or alternatively, the SSCL decoding scheme may include operation S24b of sorting the 4L reliability values. Accordingly, similar to that described above with reference to FIG. 4A, an operation of sorting reliability values may increase the complexity of a decoding method based on the SSCL decoding scheme. Furthermore, as described below with reference to FIGS. 7A and 7B, sorting the 4L reliability values (e.g. operation S24b) may be omitted from a decoding method based on an SC decoding scheme.

Figure 7A:
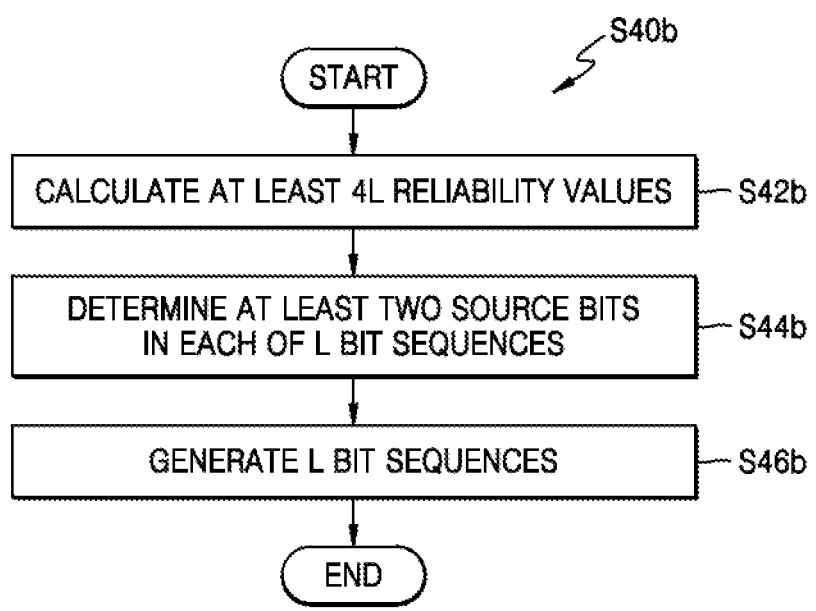
FIG. 7A is a flowchart of an example of a decoding method according to an example embodiment.

FIG. 7A is a flowchart of an example of a decoding method according to an example embodiment. FIG. 7B is a diagram of an example of a decoding tree formed using a decoding method according to an example embodiment. Specifically, the flowchart of FIG. 7A illustrates an example of operation S40 of FIG. 2, and FIG. 7B illustrates an example of a decoding tree formed due to operation S40b of FIG. 7A. As described above with reference to FIG. 2, an operation of sequentially determining remaining Y source bits based on a second decoding scheme may be performed in operation S40b of FIG. 7A. In some embodiments, operation S40b of FIG. 7A may be performed by the decoder 25 of FIG. 1. Hereinafter, FIGS. 7A and 7B will be described with reference to FIGS. 1 and 3. The same description as in FIGS. 6A and 6B will be omitted from the description of FIGS. 7A and 7B.

Referring to FIG. 7A, in operation S40b, Y source bits included in the second bit group BG2 may be sequentially determined based on an SC decoding scheme, which is an example of the second decoding scheme of FIG. 2. In the example of FIG. 7A, the SC decoding scheme may perform a decision based on reliability values in each of L bit sequences generated based on a list decoding scheme adopted in operation S20 of FIG. 2 (e.g., the SSCL decoding scheme of FIG. 6A). Additionally or alternatively, the SC decoding scheme may maintain the L bit sequences as candidates. A decoding tree formed due to operation S40b may include a simplified Rate-0 (SRate-0) node, a simplified REP (SREP) node, a simplified SPC (SSPC) node, and a simplified Rate-1 (SRate-1) node, which respectively correspond to a Rate-0 node, an REP node, an SPC node, and a Rate-1 node of the SSCL decoding scheme. L may be assumed to be 2 in the decoding tree of FIG. 7B (L=2). As shown in FIG. 7A, operation S40b may include a plurality of operations (e.g., S42b, S44b, and S46b).

In operation S42b, an operation of calculating 4L reliability values may be performed. For example, as shown in FIG. 7B, the decoder 25 may determine (X−2)-th and (X−1)-th source bits $u_{X-2}$ and $u_{X-1}$ based on a first decoding scheme (e.g., the SSCL decoding scheme) and then attempt to determine X-th and (X+1)-th source bits $u_X$ and $u_{X+1}$ based on the SC decoding scheme. Similar to the decoding tree of FIG. 5B, the (X−2)-th source bit $u_{X-2}$ may have a value of '0' as a frozen bit, while the (X−1)-th to (X+1)-th source bits $u_{X-1}$ to $u_{X+1}$ may be information bits. The decoder 25 may calculate first to eighth reliability values R1 to R8 from two bit sequences (i.e., { . . . , 0, 0} and { . . . , 0, 1}) corresponding to the (X−2)-th and (X−1)-th source bits $u_{X-2}$ and $u_{X-1}$.

In operation S44b, an operation of determining at least two source bits in each of the L bit sequences may be performed. In some embodiments, the decoder 25 may determine a bit stream including at least two bits (e.g., a bit stream corresponding to a high reliability value from a group of reliability values respectively corresponding to '00,' '01,' '10,' and '11') as values of source bits. For example, as shown in FIG. 7B, the decoder 25 may determine the first reliability value R1, which has the highest value, from a group including the first to fourth reliability value R1 to R4, and determine the sixth reliability value R6, which has the highest value, from a group including the fifth to eighth reliability values R5 to R8.

In operation S46b, an operation of generating L bit sequences may be performed. In some embodiments, the decoder 25 may decide values of source bits in each of the groups of reliability values and generate the L bit sequences. For example, as shown in FIG. 7B, two new bit sequences (i.e., { . . . , 0, 0, 0, 0} and { . . . , 0, 1, 0, 1}) may be generated as candidates based on the first reliability value R1 and the sixth reliability value R6, which are determined in operation S44b. As a result, to generate the L bit sequences based on the 4L reliability values, an operation of searching a highest reliability value, from among 2L reliability values, may be performed twice. In this case, complexity may be much lower than when the 4L reliability values are sorted in operation S24b of FIG. 6A.

Figure 8:
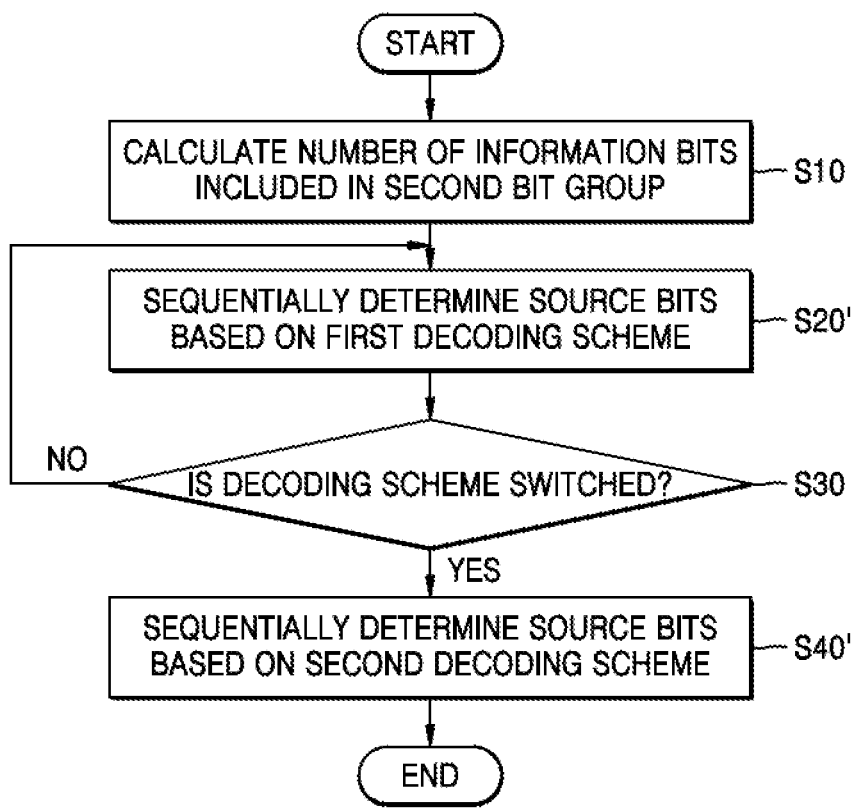
FIG. 8 is a flowchart of an example of a decoding method according to an example embodiment.

FIG. 8 is a flowchart of an example of a decoding method according to an example embodiment. As shown in FIG. 8, the decoding method may include a plurality of operations (e.g., S10, S20', S30, and S40'). As compared to the decoding method of FIG. 2, the decoding method of FIG. 8 may further include operation S10 of determining a position of a source bit, at which a decoding scheme is switched, and operation S30 of switching the decoding scheme based on the determined position. In some embodiments, the decoding method of FIG. 8 may be performed by the decoder 25 of FIG. 2. Hereinafter, FIG. 8 will be described with reference to FIGS. 1 and 3, and the same description as in FIG. 2 will be omitted from the description of FIG. 8.

In operation S10, an operation of calculating the number of information bits included in the second bit group BG2 may be performed. For example, the decoder 25 may calculate the number T of information bits included in the second bit group BG2 based on the number N of source bits included in source data SRC' and the number of information bits included in the source data SRC'. In some embodiments, the number T of information bits included in the second bit group BG2 may be limited to less than half of the number K of information bits included in the source data SRC' (T≤K/2). In some embodiments, because the decoder 25 knows indices of frozen bits (or information bits) in the source data SRC', the decoder 25 may calculate the number T of information bits included in the second bit group BG2. Additionally or alternatively, the decoder may calculate a size X of the first bit group BG1, the number of information bits included in the first bit group BG1, a size Y of the second bit group BG2, and indices of information bits (or frozen bits) in the first and second bit groups BG1 and BG2. Furthermore, in some embodiments, the decoder 25 may obtain T corresponding to N and K by referring to a lookup table. Additionally or alternatively, the decoder 25 may obtain T by substituting at least one of N and K as an argument into a predefined function. An example of operation S10 will be described with reference to FIG. 9.

In operation S20', an operation of sequentially determining the source bits based on a first decoding scheme may be performed. Next, in operation S30, an operation of determining whether the decoding scheme is to be switched may be performed. As described above, when the number T of information bits included in the second bit group BG2 is calculated in operation S10, a start index (i.e., (X+1)) of the second bit group BG2 including source bits, which are determined based on a second decoding scheme, may be determined because the positions of the frozen bits included in the source data SRC' are known to the receiver 20 (or the decoder 25). The decoder 25 may determine X+1 as an index of an information bit or an index of a frozen bit, based on the number T of information bits included in the second bit group BG2 and the positions of the frozen bits. The decoder 25 may determine whether the decoding scheme is to be switched, based on the index of the source bit. As shown in FIG. 8, when an index of a source bit to be determined is less than or equal to X, operation S20' may be performed again. Otherwise, when the index of the source bit to be determined is greater than (X+1), operation S40' may be subsequently performed. In operation S40', an operation of sequentially determining the source bits based on the second decoding scheme may be performed.

Figure 9:
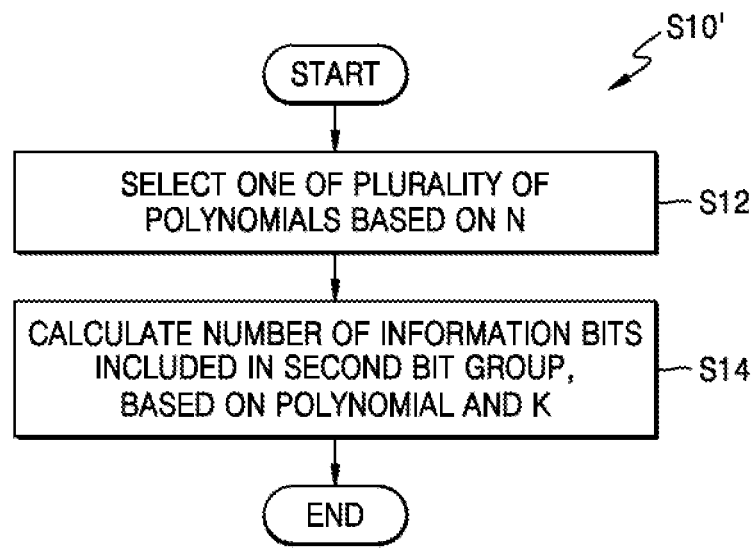
FIG. 9 is a flowchart of an example of a decoding method according to an example embodiment.

FIG. 9 is a flowchart of an example of a decoding method according to an example embodiment. Specifically, the flowchart of FIG. 9 illustrates an example of operation S10 of FIG. 8. As described above with reference to FIG. 8, an operation of calculating the number T of information bits included in the second bit group BG2 may be performed in operation S10' of FIG. 9. As shown in FIG. 9, operation S10' may include operations S12 and S14. Hereinafter, FIG. 9 will be described with referent FIG. 3.

In operation S12, an operation of selecting one of a plurality of polynomials based on N may be performed. For example, the decoder 25 may include the plurality of polynomials, each of which has the number K of information bits included in source data SRC' as a variable, and select one of the plurality of polynomials based on a size of the source data SRC', for example, the number N of source bits included in the source data SRC'. For example, the plurality of polynomials may respectively correspond to different values of N. In some embodiments, the plurality of polynomials may be predefined. The receiver 20 may include a memory (e.g., non-volatile memory) configured to store the plurality of polynomials. The decoder 25 may access the memory and refer to the plurality of polynomials. In some embodiments, the plurality of polynomials may include higher-degree polynomials as N increases. For example, in a polar code, N may match $2^P$ (P is an integer greater than 0), and the plurality of polynomials may include a degree 1 polynomial corresponding to N of 64 and a degree 2 polynomial corresponding to N of 128.

In operation S14, an operation of calculating the number of information bits included in the second bit group BG2 may be performed based on the selected polynomial and K. For example, the decoder 25 may calculate the number T of information bits included in the second bit group BG2 by substituting the number K of information bits included in the source data SRC' into the polynomial selected in operation S12.

Figure 10:
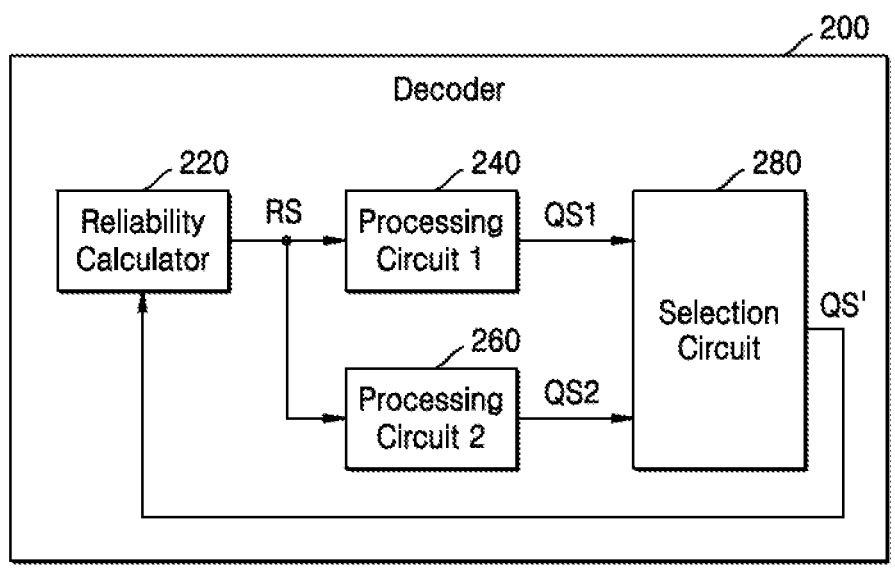
FIG. 10 is a block diagram of an example of a decoder according to an example embodiment.

FIG. 10 is a block diagram of an example of a decoder 200 according to an example embodiment. As shown in FIG. 10, the decoder 200 may include a reliability calculator 220, a first processing circuit 240, a second processing circuit 260, and a selection circuit 280. However, the decoder 25 of FIG. 1 is not limited to the decoder 200 of FIG. 10.

The reliability calculator 220 may receive a plurality of bit sequences QS' from the selection circuit 280. Additionally or alternatively, the reliability calculator 220 may calculate a plurality of reliability values RS corresponding to the plurality of bit sequences QS'. In some embodiments, as described above with reference to FIGS. 4A and 5A, the reliability calculator 220 may calculate 2L reliability values from L bit sequences. In some embodiments, as described above with reference to FIGS. 6A and 7A, the reliability calculator 220 may calculate at least 4L reliability values from the L bit sequences. As shown in FIG. 10, the reliability calculator 220 may provide the plurality of reliability values RS to the first processing circuit 240 and the second processing circuit 260.

The first processing circuit 240 may generate a plurality of first bit sequences QS1 based on the plurality of reliability values RS according to a first decoding scheme. In some embodiments, as described above with reference to FIG. 4A, the first processing circuit 240 may sort the 2L reliability values and generate L bit sequences as the plurality of first bit sequences QS1 based on L upper reliability values. In some embodiments, as described above with reference to FIG. 6A, the first processing circuit 240 may sort the 4L reliability values and generate L bit sequences as the plurality of first bit sequences QS1 based on the L upper reliability values.

The second processing circuit 260 may generate a plurality of second bit sequences QS2 based on the plurality of reliability values RS according to a second decoding scheme. In some embodiments, as described above with reference to FIG. 5A, the second processing circuit 260 may select a reliability value from each of L pairs of reliability values and generate L bit sequences as the plurality of second bit sequences QS2. Furthermore, in some embodiments, as described above with reference to FIG. 7A, the second processing circuit 260 may select a reliability value from each of groups of reliability values and generate L bit sequences as the plurality of second bit sequences QS2.

Because the first decoding scheme has higher complexity than the second decoding scheme, the first processing circuit 240 may cost more than the second processing circuit 260. For example, the first processing circuit 240 may have a larger area, a higher power consumption, and a longer processing time than the second processing circuit 260. For example, the first processing circuit 240 may include a circuit configured to perform an operation of sorting 2L reliability values or at least 4L reliability values. Therefore, the first processing circuit 240 may cost more than the second processing circuit 260. In some embodiments, the first processing circuit 240 and the second processing circuit 260 may operate in synchronization with clocks, and the number of clock cycles used for the first processing circuit 240 to generate the plurality of first bit sequences QS1 may be greater than the number of clock cycles used for the second processing circuit 260 to generate the plurality of second bit sequences QS2.

The selection circuit 280 may receive the plurality of first bit sequences QS1 from the first processing circuit 240 and receive the plurality of second bit sequences QS2 from the second processing circuit 260. The selection circuit 280 may select one of the plurality of first bit sequences QS1 and the plurality of second bit sequences QS2, and provide a plurality of bit sequences QS', which are selected, to the reliability calculator 220. For example, the selection circuit 280 may select the plurality of first bit sequences QS1 during operation S20 of FIG. 2 (or operation S20' of FIG. 8) and select the plurality of second bit sequences QS2 during operation S40 of FIG. 2 (or operation S40' of FIG. 8).

In some embodiments, the selection circuit 280 may disable a processing circuit configured to generate a plurality of bit sequences, which are not selected, and reduce power consumption of the decoder 200. For instance, the second processing circuit 260 may be disabled during operation S20 of FIG. 2 (or operation S20' of FIG. 8), while the first processing circuit 240 may be disabled during operation S40 of FIG. 2 (or operation S40' of FIG. 8). An example of the selection circuit 280 will be described below with reference to FIG. 11. For example, the processing circuit may be disabled based on clock gating or the blocking of power supply.

Figure 11:
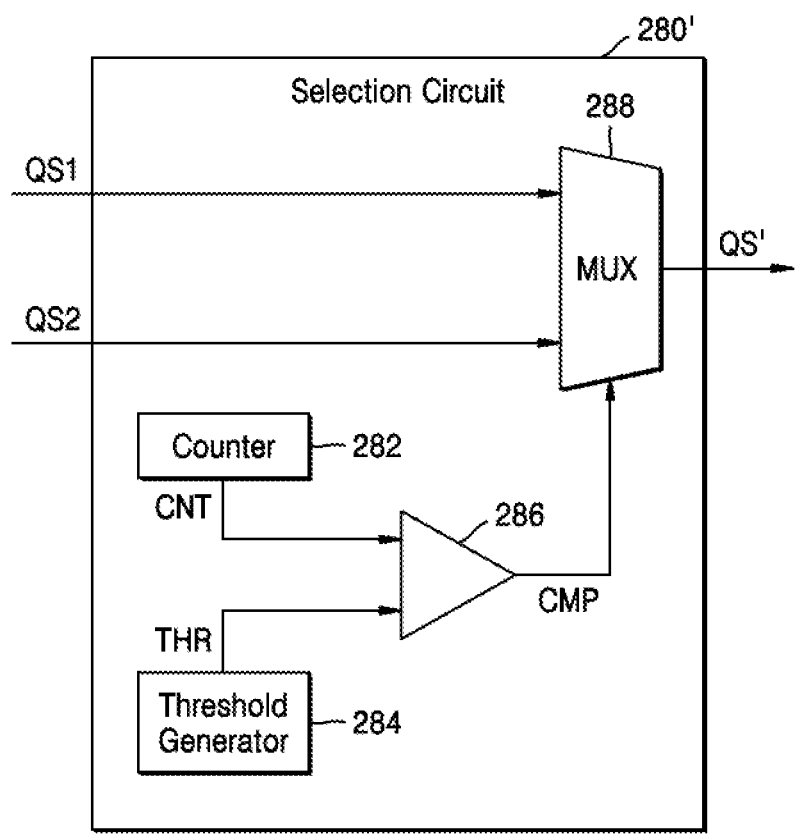
FIG. 11 is a block diagram of an example of a selection circuit according to an example embodiment.

FIG. 11 is a block diagram of an example of a selection circuit 280' according to an example embodiment. As described above with reference to FIG. 10, the selection circuit 280' of FIG. 11 may select one of a plurality of first bit sequences QS1 and a plurality of second bit sequences QS2 and output a plurality of bit sequences QS'. As shown in FIG. 11, the selection circuit 280' may include a counter 282, a threshold generator 284, a comparator 286, and a multiplexer 288. Hereinafter, FIG. 11 will be described with reference to FIG. 3.

The counter 282 may count source bits determined in a decoding process. For example, the counter 282 may be an up-counter and generate a count signal CNT, which increases from 1 to N during a process of sequentially determining the source bits. In some embodiments, the counter 282 may generate a count signal CNT by counting frozen bits or information bits instead of counting the source bits. To this end, the counter 282 may receive indices of the frozen bits (or indices of the information bits) included in source data SRC' from the outside.

The threshold generator 284 may generate a threshold value THR to be compared with the count signal CNT by the comparator 286. Additionally or alternatively, the threshold value THR may define a point in time at which a decoding scheme is switched from a first decoding scheme to a second decoding scheme. In some embodiments, the counter 282 may be an up-counter, and the threshold value THR may have a value related to a first bit group BG1. For example, when the count signal CNT indicates the number of determined source bits, the threshold generator 284 may correspond to a size (i.e., X) of the first bit group BG1. Additionally or alternatively, when the count signal CNT indicates the number of determined frozen bits, the threshold generator 284 may correspond to the number of frozen bits included in the first bit group BG1. Additionally or alternatively, when the count signal CNT indicates the number of determined information bits, the threshold generator 284 may correspond to the number of information bits included in the first bit group BG1. In some embodiments, the counter 282 may be a down-counter, and the threshold value THR may have a value related to a second bit group BG2. In some embodiments, as described above with reference to FIG. 9, the threshold generator 284 may calculate the number T of information bits included in the second bit group BG2 and generate the threshold value THR based on the number T.

The comparator 286 may compare a value of the count signal CNT with the threshold value THR and generate a comparison signal CMP. The multiplexer 288 may select one of the plurality of first bit sequences QS1 and the plurality of second bit sequences QS2 in response to the comparison signal CMP and output the plurality of bit sequences QS'. For example, when the value of the count signal CNT is less than or equal to the threshold value THR, the comparator 286 may generate an inactive comparison signal CMP, and the multiplexer 288 may select the plurality of first bit sequences QS1 in response to the inactive comparison signal CMP. Additionally or alternatively, when the value of the count signal CNT exceeds the threshold value THR, the comparator 286 may generate an active comparison signal CMP, and the multiplexer 288 may select the plurality of second bit sequences QS2 in response to the active comparison signal CMP. In some embodiments, the comparison signal CMP or an enable signal generated from the comparison signal CMP may be provided to each of the first and second processing circuits 240 and 260 of FIG. 10, and the first and second processing circuits 240 and 260 may be enabled or disabled in response to the comparison signal CMP.

Figure 12:
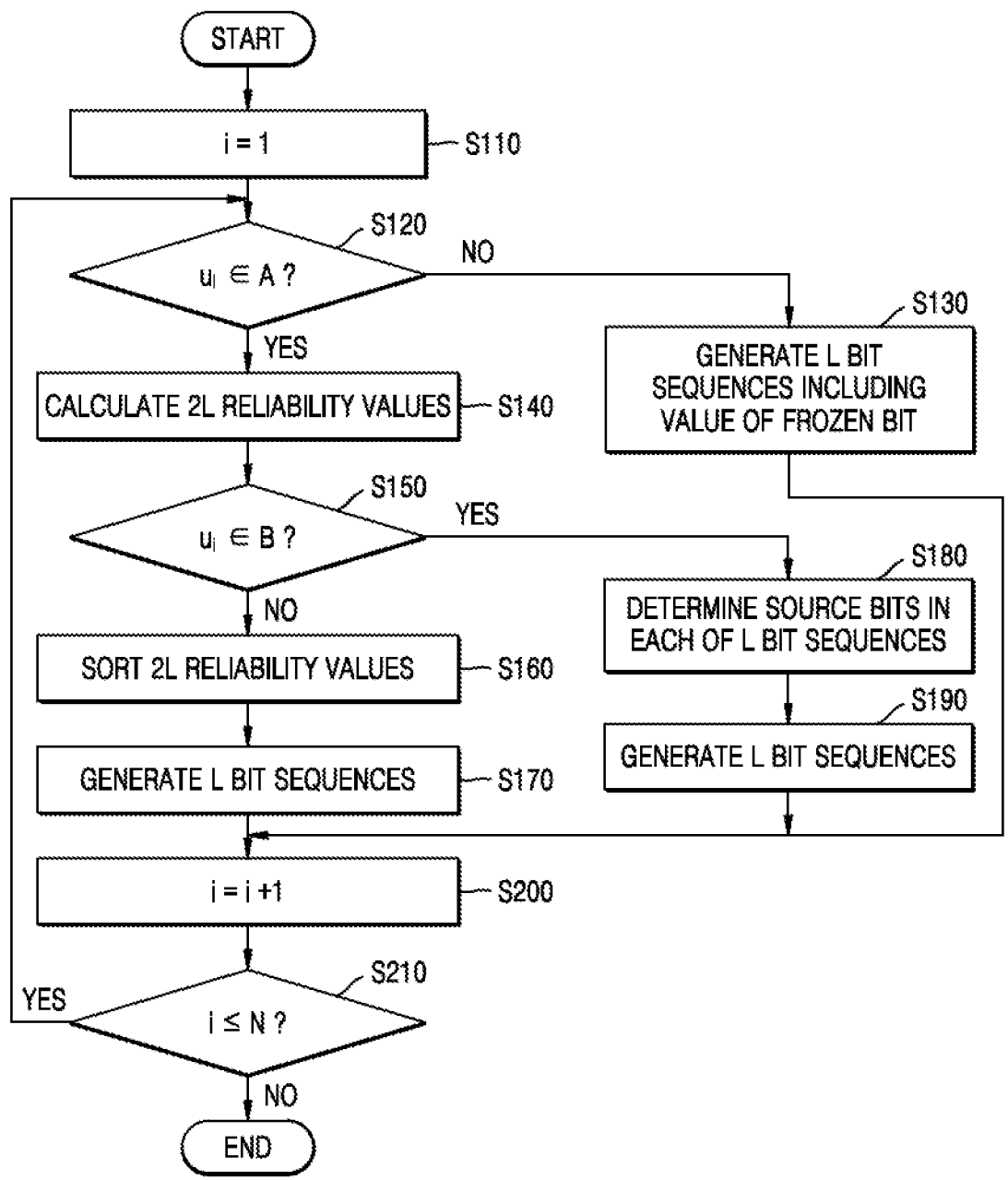
FIG. 12 is a flowchart of examples of a decoding method according to an example embodiment.

FIG. 12 is a flowchart of examples of a decoding method according to an example embodiment. Specifically, FIG. 12 illustrates a decoding method based on an SCL decoding scheme and an SC decoding scheme. In some embodiments, the decoding method of FIG. 12 may be performed by the decoder 25 of FIG. 1. Hereinafter, FIG. 12 will be described with reference to FIGS. 1 and 3. The same description as those provided above with reference to the drawings will be omitted from the description of FIG. 12.

In operation S110, an initialization operation may be performed. For example, as shown in FIG. 12, a variable i indicating an index of a source bit may be initialized to 1.

In operation S120, an operation of determining whether an i-th source bit $u_1$ is included in a set A may be performed. The set A may be a set of source bits corresponding to information bits, from among source bits included in source data SRC'. As shown in FIG. 12, when the i-th source bit $u_i$ is not included in the set A, for example, when the i-th source bit $u_i$ is a frozen bit, an operation of generating L bit sequences including a value of the frozen bit may be performed in operation S130.

When the i-th source bit $u_i$ is included in the set A, for example, when the i-th source bit $u_i$ is an information bit, an operation of calculating 2L reliability values may be performed in operation S140. The 2L reliability values may include a reliability value corresponding to a case in which a subsequent information bit is '0' and a reliability value corresponding to a case in which the subsequent information bit is '1,' in each of the L bit sequences.

In operation S150, an operation of determining whether the i-th source bit $u_i$ is included in a set B may be performed. The set B may be a set of source bits, which are determined based on the SC decoding scheme, from among information bits included in the source data SRC'. For example, the source bits included in the set B may correspond to information bits included in a second bit group BG2.

When the i-th source bit $u_i$ is not included in the set B, an operation of sorting the 2L reliability values may be performed in operation S160. Next, an operation of generating L bit sequences may be performed in operation S170. The 2L reliability values may be sorted to determine L upper reliability values, and L new bit sequences corresponding to the L upper reliability values may be generated.

Otherwise, when the i-th source bit $u_i$ is included in the set B, an operation of determining a source bit in each of the L bit sequences may be performed in operation S180. Next, an operation of L bit sequences may be performed in operation S190. A reliability value may be selected from each of L pairs of reliability values, and L new bit sequences corresponding to L selected reliability values may be generated. Accordingly, the operation of sorting the 2L reliability values may be omitted in operations S180 and S190.

In operation 200, the variable i may be increased by 1 to determine the next source bit. In operation S210, the variable i may be determined to be less than or equal to the number N of source bits included in the source data SRC'. As shown in FIG. 12, when the variable i is less than or equal to N, for example, when source bits to be determined remain, operation S120 may be subsequently performed. Otherwise, when the N source bits are determined, the decoding method of FIG. 12 may end.

Figure 13:
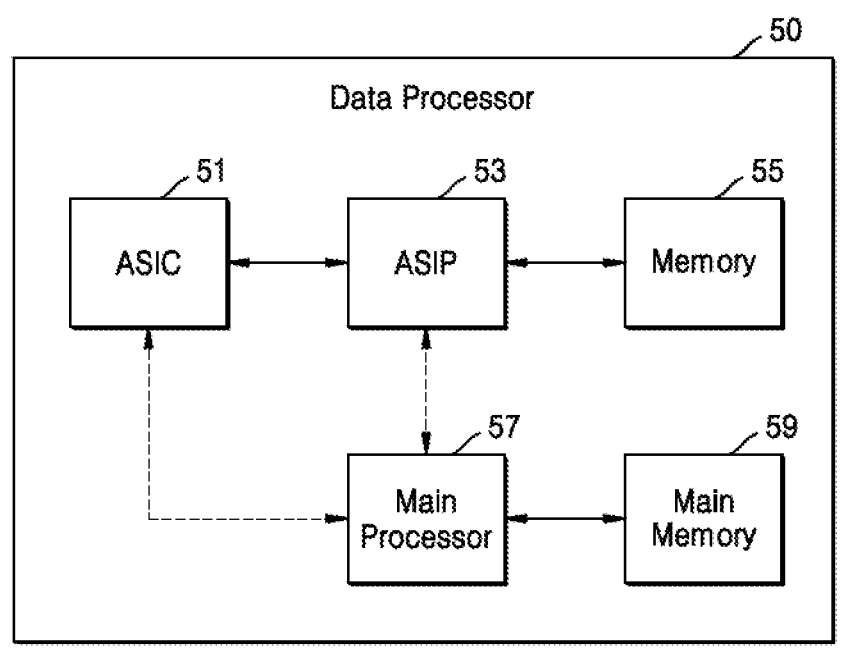
FIG. 13 is a block diagram of a data processor according to an example embodiment.

FIG. 13 is a block diagram of a data processor 50 according to an example embodiment. In some embodiments, the decoder 25 of FIG. 1 or the decoder 200 of FIG. 10 may be implemented in the data processor 50 of FIG. 13.

As shown in FIG. 13, the data processor 50 may include an application-specific integrated circuit (ASIC) 51, an application-specific instruction set processor (ASIP) 53, a memory 55, a main processor 57, and a main memory 59. In some embodiments, at least two of the ASIC 51, the ASIP 53, and the main processor 57 may communicate with each other. In some embodiments, at least two of the ASIC 51, the ASIP 53, the memory 55, the main processor 57, and the main memory 59 may be embedded in one semiconductor chip.

The ASIP 53, which may be a customized IC, may support a dedicated instruction set for a specific application and execute instructions included in the instruction set. The memory 55 may communicate with the ASIP 53 and serve as a non-transitory storage device configured to store a plurality of instructions executed by the ASIP 53. For example, non-limiting examples of the memory 55 may include an arbitrary type of memory, which is accessible by the ASIP 53, such as random access memory (RAM), read-only memory (ROM), tape, a magnetic disc, an optical disc, a volatile memory, a non-volatile memory, and a combination thereof. In some embodiments, the memory 55 may store data (e.g. a lookup table and/or a plurality of polynomials) used for calculating the number of information bits included in the second bit group described above with reference to FIGS. 8 and 9.

The main processor 57 may execute the plurality of instructions and control the data processor 50. For example, the main processor 57 may control the ASIC 51 and the ASIP 53 or process a user's inputs to a receiver (e.g. a receiver 20 in FIG. 1). The main memory 59 may communicate with the main processor 57 and include an arbitrary type of memory, which is accessible by the main processor 57. In some embodiments, the main memory 59, which is a non-transitory storage device, may store the plurality of instructions executed by the main processor 57.

In some embodiments, a decoding method for channel coding may be performed by at least one of the components included in the data processor 50 of FIG. 13. For example, at least some of the operations of the decoder 25 of FIG. 1 may be implemented as a plurality of instructions stored in the memory 55. Additionally or alternatively, the ASIP 53 may execute the plurality of instructions stored in the memory 55 and perform at least one of operations of the decoding method. In some embodiments, at least one of the operations of the decoding method may be performed by a hardware block (e.g., 200 of FIG. 10) designed by logic synthesis, and the hardware block 200 may be included in the ASIC 51. In some embodiments, at least one of the operations of the decoding method may be implemented as a plurality of instructions stored in the main memory 59. The main processor 57 may perform at least one of operations of the decoding method by executing the plurality of instructions stored in the main memory 59.

While the inventive concept has been particularly shown and described with reference to embodiments thereof, it will be understood that various changes in form and details may be made therein without departing from the spirit and scope of the following claims.

What is claimed is:

1. A decoding method for sequentially determining a series of source bits from a codeword, the method comprising:
    performing a first decoding operation to sequentially determine an initial X source bits from the series of source bits; and
    performing a second decoding operation to sequentially determine a remaining Y source bits from the series of source bits,
    wherein performing the first decoding operation comprises sorting at least 2L reliability values, which are calculated from L bit sequences, where L is an integer greater than 0, and
    performing the second decoding operation comprises determining a source bit in each of the L bit sequences based on the at least 2L reliability values,
    wherein the codeword is encoded based on a polar code, the first decoding operation is performed based on a successive cancellation list (SCL) decoding scheme, and
        the second decoding operation is performed based on a successive cancellation (SC) decoding scheme.

2. The method of claim 1, further comprising calculating the initial X source bits or the remaining Y source bits based on a number of source bits included in the series of source bits and a number of information bits included in the series of source bits.

3. The method of claim 2, wherein calculating the initial X source bits or the remaining Y source bits comprises:
    selecting a polynomial from a plurality of polynomials based on the number of source bits included in the series of source bits; and
    calculating the initial X source bits or the remaining Y source bits based on the selected polynomial and the number of information bits included in the series of source bits.

4. The method of claim 3, wherein selecting the polynomial comprises selecting a degree 1 polynomial comprising the number of information bits as a variable when the number of source bits included in the series of source bits is 64.

5. The method of claim 2, wherein the number of information bits included in the remaining Y source bits is less than or equal to half of the number of information bits included in the series of source bits.

6. The method of claim 1, wherein performing the first decoding operation further comprises generating L new bit sequences corresponding to L upper reliability values based on the at least 2L reliability values, which are sorted, and
    wherein performing the second decoding operation further comprises generating L new bit sequences and determining source bits from respective L new bit sequences.

7. An apparatus for polar decoding, the apparatus being configurable to sequentially determine a series of source bits from a codeword encoded based on a polar code by comprising:
    a reliability calculator configured to calculate at least 2L reliability values from L bit sequences, where L is an integer greater than 0;
    a first processing circuit configured to sort the at least 2L reliability values and respectively generate first L new bit sequences with L upper reliability values;
    a second processing circuit configured to determine a source bit in each of the L bit sequences based on the at least 2L reliability values and generate second L new bit sequences; and
    a selection circuit configured to select one of the first processing circuit and the second processing circuit based on indices of source bits included in the series of source bits.

8. The apparatus of claim 7, wherein the selection circuit comprises:
    a counter configured to count sequentially determined source bits;
    a comparator configured to generate a comparison signal activated when an output of the counter exceeds a threshold value; and
    a multiplexer configured to select the second L new bit sequences generated by the second processing circuit in response to the activated comparison signal.

9. The apparatus of claim 8, wherein the selection circuit further comprises a threshold generator configured to generate the threshold value based on a number of source bits included in the series of source bits and a number of information bits included in the series of source bits.

10. The apparatus of claim 9, wherein the threshold generator is configured to select a polynomial based on the number of source bits included in the series of source bits and calculate the threshold value based on the selected polynomial and the number of information bits included in the series of source bits.

11. The apparatus of claim 10, wherein the threshold generator selects a degree 1 polynomial comprising the number of information bits as a variable when the number of source bits included in the series of source bits is 64.

12. A polar decoding method by which a series of source bits is obtained from a codeword encoded based on a polar code, the method comprising:
    performing a first decoding operation in which source bits included in a first bit group are sequentially determined from the codeword based on a successive cancellation list (SCL) decoding scheme; and
    performing a second decoding operation in which source bits included in a second bit group are sequentially determined from the codeword based on a successive cancellation (SC) decoding scheme,
    wherein the first bit group comprises an initially determined source bit, and
    the second bit group comprises a finally determined source bit.

13. The method of claim 12, further comprising determining that the first decoding operation ends and that the second decoding operation starts based on indices of the determined source bits included in the first bit group and a number of the source bits included in the second bit group.

14. The method of claim 12, further comprising calculating a number of the source bits included in the second bit group based on a number of source bits included in the series of source bits and a number of information bits included in the series of source bits.

15. The method of claim 14, wherein calculating the number of the source bits included in the second bit group comprises:
   selecting a polynomial from a plurality of polynomials based on the number of source bits included in the series of source bits; and
   calculating the number of source bits included in the second bit group based on the selected polynomial and the number of information bits included in the series of source bits.

16. The method of claim 15, wherein selecting the polynomial comprises selecting a degree 1 polynomial comprising the number of information bits as a variable when the number of source bits included in the series of source bits is 64.

17. The method of claim 14, wherein a number of information bits included in the second bit group is less than or equal to half of the number of information bits included in the series of source bits.

18. The method of claim 12, wherein performing the first decoding operation comprises:
   calculating 2L reliability values from L bit sequences, where L is an integer greater than 0; and
   generating L new bit sequences with L upper reliability values respectively by sorting the 2L reliability values, and
   wherein performing the second decoding operation comprises:
   calculating 2L reliability values from L bit sequences; and
   generating L new bit sequences by determining a source bit in each of the L bit sequences based on the 2L reliability values.

19. The method of claim 12, wherein performing the first decoding operation comprises:
   calculating at least 4L reliability values from L bit sequences, where L is an integer greater than 0; and
   generating L new bit sequences with L upper reliability values respectively by sorting the at least 4L reliability values, and
   wherein performing the second decoding operation comprises:
   calculating at least 4L reliability values from L bit sequences; and
   generating L new bit sequences by determining at least two source bits in each of the L bit sequences, based on the at least 4L reliability values.

* * * * *